(12) United States Patent
Hashimoto

(10) Patent No.: US 6,229,405 B1
(45) Date of Patent: May 8, 2001

(54) LOW-VOLTAGE OSCILLATION AMPLIFYING CIRCUIT

(75) Inventor: Masami Hashimoto, Hino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/341,333

(22) PCT Filed: Nov. 13, 1998

(86) PCT No.: PCT/JP98/05115

§ 371 Date: Aug. 30, 1999

§ 102(e) Date: Aug. 30, 1999

(87) PCT Pub. No.: WO99/26334

PCT Pub. Date: May 27, 1999

(30) Foreign Application Priority Data

Nov. 14, 1997 (JP) .................................................... 9-313278
Nov. 14, 1997 (JP) .................................................... 9-313280

(51) Int. Cl.[7] .............................. H03B 5/06; H03B 5/36; H03F 3/193; H03K 3/353
(52) U.S. Cl. .................................. 331/116 FE; 330/277; 326/121
(58) Field of Search ...................... 331/116 FE; 330/277; 326/121

(56) References Cited

U.S. PATENT DOCUMENTS 4,196,404 * 4/1980 Ebihara ........................... 331/116 FE
5,532,652 * 7/1996 Koyama et al. ................ 331/116 FE
5,900,787 * 5/1999 Yoshimura ..................... 331/116 FE

FOREIGN PATENT DOCUMENTS 1-94704    4/1989  (JP) .
3-273706  12/1991  (JP) .
6-204741   7/1994  (JP) .

* cited by examiner

Primary Examiner—Siegfried H. Grimm
(74) Attorney, Agent, or Firm—Oliff & Berridge PLC

(57) ABSTRACT

A low voltage oscillation amplifying circuit including a switching circuit 110 consisting of first and second MOSFETs 1 and 2 of the same conductivity type, which are connected in series and have the gate electrodes connected to each other; and an amplifying circuit 120 including a third MOSFET 3 of a first conductivity type and a fourth MOSFET 4 of a second conductivity type, the gate electrodes of these third and fourth MOSFETs being connected to each other and the drain electrodes of these third and fourth MOSFETs being also connected to each other. The body voltages of the P-type MOSFET 4 and the N-type MOSFET 3 are controlled by a control signal and an inverted signal thereof, respectively. During operation of the amplifying circuit, the threshold voltages of the third and fourth MOSFETs 3 and 4 are made seemingly low, so that the amplifying circuit can be operated at a low voltage. In addition, the threshold voltage of the second MOSFET can be seemingly increased when the switching circuit is turned off during non-operation of the amplifying circuit, making it possible to prevent leakage current almost completely.

7 Claims, 3 Drawing Sheets

LOW-VOLTAGE OSCILLATION AMPLIFYING CIRCUIT

TECHNICAL FIELD

The present invention relates to a low voltage oscillation amplifying circuit having an insulated gate field effect transistor (hereinafter referred to a MOSFET), and also to a portable electronic instrument using the circuit. This low voltage oscillation amplifying circuit can be operated at a very low voltage and prevent a leakage current when an operation of the circuit is stopped.

BACKGROUND ART

A conventional oscillation amplifying circuit using a MOSFET, which is incorporated in a semiconductor integrated circuit device, uses a circuit based on a CMOS inverter circuit typified by the circuit construction as shown in FIGS. 2 and 3. An amplifying circuit 50 shown in FIGS. 2 and 3 includes a P-type MOSFET 51 and an N-type MOSFET 52. The gate electrodes of these MOSFETs are connected to each other and the drain electrodes are also connected to each other. The circuit shown in FIG. 3 further includes a switching circuit 60 having a single P-type MOSFET 61. In the case where the amplifying circuit 50 is operated at a low voltage, each of the MOSFETs 51 and 52 is channel-doped so as to specially lower the threshold voltage.

Further, the miniaturization of the integrated circuit has been progressed in recent years, and it is required to lower the power source voltage in order to prevent the elevation in the intensity of the electric field involved in the development of the miniaturization. Because of the increase in demand for portable electronic instruments, an integrated circuit operable at a low voltage is required to achieve the power saving. In general, it is desirable to decrease the threshold voltage of the MOSFET in order to make the integrated circuit operable at a low voltage. A simple logic circuit can be operated if the power source voltage exceeds the threshold voltage of the P-type MOSFET or the N-type MOSFET, whichever of a higher threshold voltage. However, an oscillation circuit using a CMOS inverter circuit as an amplifying circuit is not operated if the power source voltage is not higher than the sum of the threshold voltages of the P-type MOSFET and the N-type MOSFET, due to the characteristics as an analog circuit. Therefore, for the low voltage oscillation, it is necessary to make the threshold voltage lower than the case of a logic circuit. However, if the threshold voltage is made very low, the voltage-current characteristics of the MOSFET can not necessarily permit the MOSFET to satisfactorily perform a sharp ON/OFF position against the gate voltage in general, even if the threshold voltage is set at a positive value. It follows that a leakage current takes place to some extent during OFF time of the MOSFET.

Under the circumstances, various problems are brought about if the threshold voltage is lowered in the conventional circuit construction described above in order to permit the circuit to be operated at a low voltage. The problems are such that, for example, the leakage current is increased during the OFF time, the yield in the manufacturing process is lowered, the channel doping step has to be added twice, leading to a high manufacturing cost, or a clock signal has to be supplied to the oscillating circuit that is separated from other components.

The present invention is devised to overcome these problems and has an objective thereof the provision of a low voltage oscillation amplifying circuit and a portable electronic instrument using the circuit. This low voltage oscillation amplifying circuit can be operated at a low voltage, can prevent leakage current when an operation of the circuit is stopped, and does not incur an increased manufacturing cost derived from an additional channel-doping step.

DISCLOSURE OF THE INVENTION

According to the present invention, there is provided a low voltage oscillation amplifying circuit, comprising:

a switching circuit including first and second MOSFETs of the same conductivity type being connected in series and having the gate electrodes connected to each other;

an amplifying circuit connected to the switching circuit and including a third MOSFET of a first conductivity type and a fourth MOSFET of a second conductivity type, drain electrodes of the third and fourth MOSFETs being connected to each other to provide a common drain electrode, and gate electrodes of the third and fourth MOSFETs being connected to each other to provide a common gate electrode;

a feedback resistor connected between the common gate electrode and the common drain electrode of the third and fourth MOSFETs;

a control circuit including a control signal terminal and an inverter circuit for outputting an inverted signal obtained by inverting a control signal inputted to the control signal terminal;

a power source of a first polarity connected to the switching circuit; and a power source of a second polarity connected to the amplifying circuit;

wherein a body of each of the third and fourth MOSFETs is insulatively isolated, a voltage of the body of the fourth MOSFET is controlled by the control signal of the control circuit, and a voltage of the body of the third MOSFET is controlled by the inverted signal.

According to the present invention, when the amplifying circuit is operated by the control signal, the body voltage of each of the third and fourth MOSFETs collectively constituting the amplifying circuit is controlled, so that the threshold voltage of each of the MOSFETs is equivalently lowered by the back gate effect. Thus, each of these MOSFETs is operated at a lower voltage. On the other hand, when the operation of the amplifying circuit is stopped by the control signal, the body voltage of each of the third and fourth MOSFETs is brought back to the original level so as to bring the threshold voltage back to the original high level. At the same time, the switching circuit is turned off by the control signal. In addition, since the switching circuit has a structure that the first and second MOSFETs of the same conductivity type are connected to each other in series, the gates electrodes of which are connected to each other, the leakage circuit in the switching circuit can be prevented even if each of these first and second MOSFETs exhibits a threshold voltage of such a level as to bring about the leakage current in a single MOSFET. To be more specific, when each of these first and second MOSFETs is in a turned off state, the connecting point between these first and second MOSFETs bears a voltage intermediate between a power source voltage of a first polarity and a power source voltage of a second polarity. The intermediate voltage is applied to the source electrode of the second MOSFET, and the power source voltage of the first polarity is applied to the gate electrode of the second MOSFET, so that a voltage difference is produced between the gate and the source of the second MOSFET. Because of the voltage difference, it becomes difficult for a leakage current to flow through the second MOSFET when the second MOSFET is in the turned off state, compared with the case where the voltage difference is zero as in the case where the power source voltage of the first polarity is applied to each of the gate and the source of the second MOSFET. This is seemingly equivalent to the condition that the threshold voltage of the second MOSFET has been increased. Accordingly, flow of a leakage current can be prevented even when the amplifying circuit is not operated.

As described above, the switching circuit includes MOSFETs of the same conductivity type that are connected in series and have the gate electrodes connected to each other. Also, the amplifying circuit includes the third and fourth MOSFETs for controlling the body voltages. By these switching and amplifying circuits, the threshold voltages of the third and fourth MOSFETs can be seemingly lowered to operate the amplifying circuit at a very low voltage, and in the OFF state, the threshold voltage of the second MOSFET in the switching circuit can be seemingly increased to prevent the leakage current almost completely.

During the operation of the amplifying circuit, the threshold voltage of each of the third and fourth MOSFETs can be equivalently lowered by the back gate effect, so that the threshold voltage need not be lowered by applying an extra ion implantation such as a channel doping, leading to reduction in the manufacturing cost.

In the present invention, the control signal terminal may be connected to the body of the fourth MOSFET, and the inverter circuit may be connected to the gate electrode of each of the first and second MOSFETs and also to the body of the third MOSFET.

The particular construction makes it possible to control the body voltage of each of the third and fourth MOSFETs. In addition, both the first and second MOSFETs constituting the switching circuit can be turned off by the inverted output of the inverter circuit.

Further, the first and second MOSFETs may be of a P-type, a source electrode of the first MOSFET may be connected to a power source of a positive polarity, the third MOSFET may be of P-type, the fourth MOSFET may be of N-type, and a source electrode of the fourth MOSFET may be connected to a power source of a negative polarity. Alternatively, the first and second MOSFETs may be of N-type, a source electrode of the first MOSFET may be connected to a power source of a negative polarity, the third MOSFET may be of N-type, the fourth MOSFET may be of P-type, and a source electrode of the fourth MOSFET may be connected to a power source of a positive polarity. The first and second MOSFETs constituting the switching circuit may be either of N-type or P-type.

In the present invention, a voltage difference between voltages of the power source of the first polarity and the power source of the second polarity may be lower than a contact voltage across the PN diode formed between the source and body in each of the third and fourth MOSFETs.

In the particular construction, the power source voltage is, for example, about 0.5 V or less, and it is possible to prevent current from flowing through the PN diode in the forward direction even during the operation of the amplifying circuit. It follows that leakage current does not take place.

Further, each MOSFET may be formed of a silicon on insulator (SOI) structure. In this case, the body of each MOSFET is isolated from each other by the insulator.

The low voltage oscillation amplifying circuit of the present invention can be applied to a portable electronic instrument. In this case, it is possible to reduce the power consumption of a portable electronic instrument.

BEST MODE OF CARRYING OUT THE INVENTION

Figure 1:
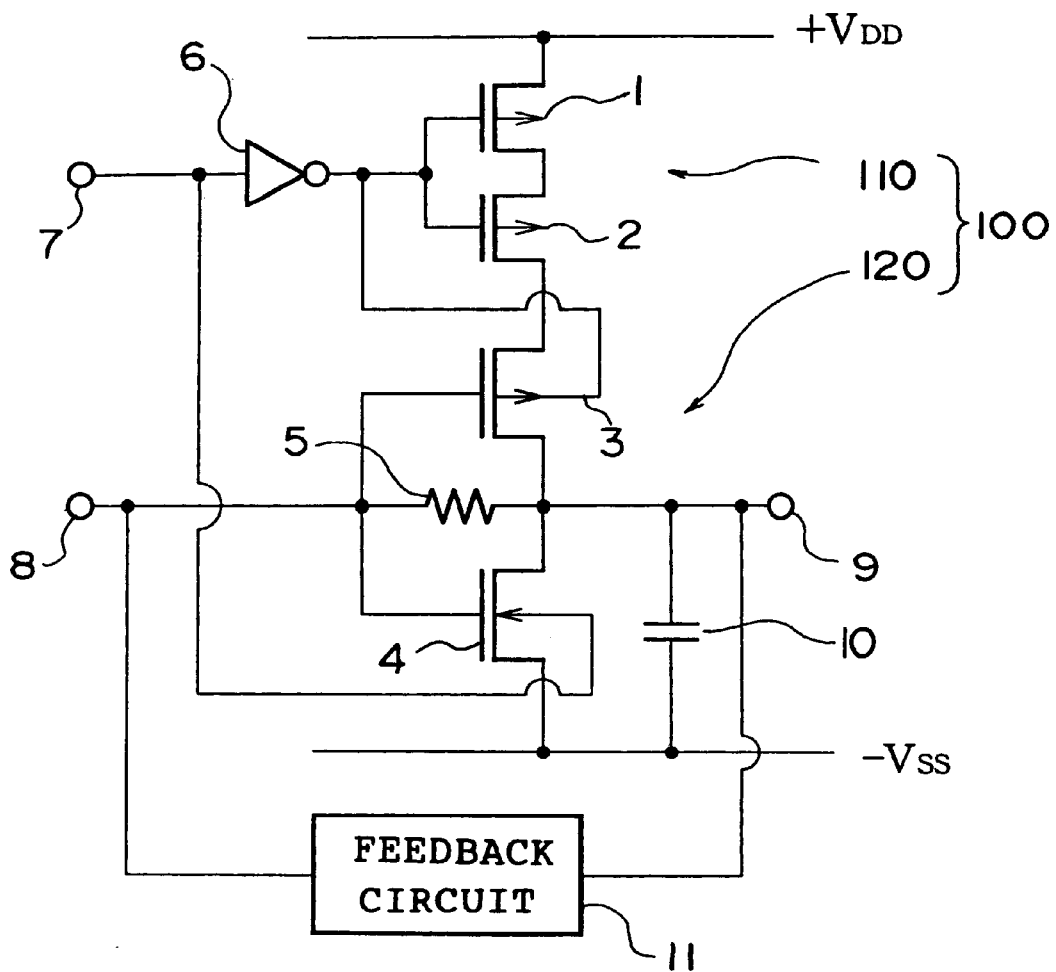
FIG. 1 is a circuit diagram showing a first embodiment of the present invention.
Figure 2:
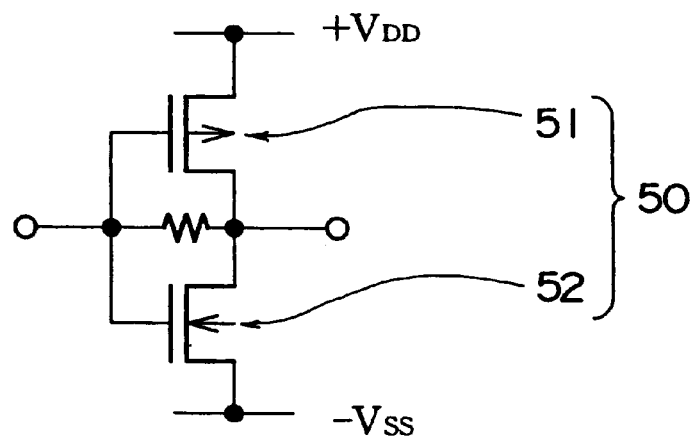
FIG. 2 is a circuit diagram exemplifying a conventional amplifying circuit.

A preferred embodiment of the present invention will now be described in detail. FIG. 1 is a circuit diagram showing an embodiment of the present invention. A wafer substrate having a SOI (silicon on insulator) structure including a buried oxide film is used in the circuit shown in FIG. 1, and the substrate (body) between the MOSFETs is insulatively isolated in principle. Also, the circuit is operated at a low power source voltage, i.e., about 0.5 V of the voltage difference between a positive power source +VDD an a negative power source −VSS.

The low voltage oscillation amplifying circuit 100 shown in FIG. 1 comprises a switching circuit 110 and an amplifying circuit 120. Each of transistors 1 and 2 constituting the switching circuit 110 is a P-type MOSFET with a low threshold voltage. The source electrode of the P-type MOSFET 1 is connected to the positive power source of +VDD. The drain electrode of the P-type MOSFET 1 is connected to the source electrode of the P-type MOSFET 2. Further, the gate electrodes of these P-type MOSFETs 1 and 2 are connected to each other.

The amplifying circuit 120 shown in FIG. 1 comprises a P-type MOSFET 3 and an N-type MOSFET 4. The source electrode of the N-type MOSFET 4 is connected to the negative power source of −VSS, and the drain electrode of the N-type MOSFET 4 is connected to the drain electrode of the P-type MOSFET 3. Further, the gate electrodes of the P and N-type MOSFETs 3 and 4 are connected to each other. The common gate electrode of these P-type MOSFET 3 and N-type MOSFET 4 is connected to a gate terminal 8, and the common drain electrode of these P-type MOSFET 3 and N-type MOSFET 4 is connected to a drain terminal 9. Furthermore, the source electrode of the P-type MOSFET 3 is connected to the drain electrode of the P-type MOSFET 2 constituting the switching circuit 110.

A feedback resistor 5 formed by a diffused resistor is connected between the gate terminal 8 and the drain terminal 9 of the amplifying circuit 120. The feedback resistor 5 serves to produce a bias voltage suitable for the amplifying circuit 120. The input gate of an inverter circuit 6 is connected to a control signal terminal 7, and the drain output is connected to the gate electrodes of the P-type MOSFETs 1 and 2 constituting the switching circuit 110 and is also connected to the substrate (body) of the P-type MOSFET 3 constituting the amplifying circuit 120. The control signal terminal 7 is connected to the substrate (body) of the N-type MOSFET 4. A capacitor 10 for the output load is connected between the drain terminal 9 of the amplifying circuit 120 and the power source voltage −VSS.

The construction of the low voltage oscillation amplifying circuit 100 of the present invention is as described above. Note that a feedback circuit 11 is interposed between the drain terminal 9 and the gate terminal 8. The low voltage oscillation amplifying circuit 100 of the present invention and the feedback circuit 11 collectively form an oscillation circuit.

Figure 4:
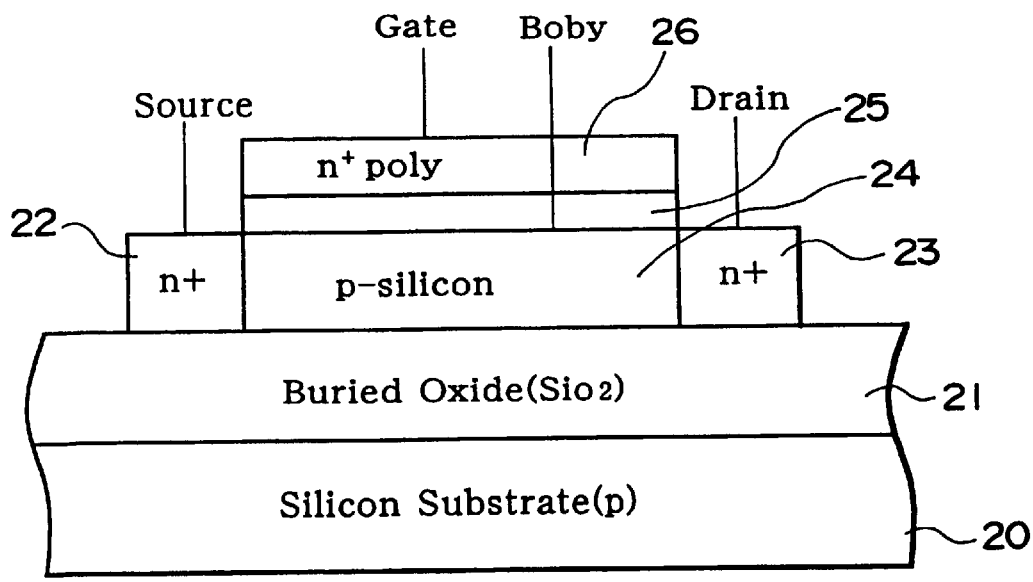
FIG. 4 is a cross sectional view showing an N-type MOSFET constituting the amplifying circuit shown in FIG. 1.

FIG. 4 is a cross sectional view showing one of the P-type MOSFET 3 and the N-type MOSFET 4 constituting the amplifying circuit 120.

As described previously, the N-type MOSFET is formed by the SOI structure in FIG. 4. To be more specific, a SiO2 film 21 is formed on a P-type silicon substrate 20, and a source drain 22 (n$^+$) and a drain region 23 (n$^+$) are formed on the SiO2 film 21. The channel region between the source region 22 and the drain region 23 is a body 24 (p$^−$) of the N-type MOSFET. The body 24 is isolated by the SiO2 film 21 from the body of the other transistors. A gate electrode 26 is formed above the body 24 with a gate oxide film 25 interposed therebetween. In this embodiment, a signal generated from the inverter circuit 6 or the control signal terminal 7 is supplied to the body 24. The body 24 is formed larger than the gate electrode 26 and a contact hole is formed in that region of the body 24 which is not covered with the gate electrode 26. The signal noted above is supplied to the body 24 through a wiring formed in the contact hole.

Next, an operation of the low voltage oscillation amplifying circuit 100 will be described below.

When the control signal generated from the control signal terminal 7 bears a high voltage (High), the output of the inverter circuit 6 bears a low voltage (Low), with the result that each of the P-type MOSFETs 1 and 2 is turned on. It follows that a power source of +VDD is supplied to the source of the P-type MOSFET 3 and, thus, the amplifying circuit 120 having the P-type MOSFET 3 and the N-type MOSFET 4 performs the function of an amplifying circuit together with the feedback resistor 5 serving to optimize the bias voltage.

It should be noted that a control signal of a high voltage generated from the control signal terminal 7 is supplied to the substrate (body) of the N-type MOSFET 4, and an inverted signal of a low voltage generated from the inverter circuit 6 is supplied to the substrate (body) of the P-type MOSFET 3. It follows that the threshold voltage of each of the P-type MOSFET 3 and the N-type MOSFET 4 is rendered low to permit these MOSFETs 3 and 4 to tend to be turned on easily by the back gate effect. Such being the situation, these MOSFETs 3 and 4 are allowed to act as the amplifying circuit 120 even if the power source voltage is low.

It should also be noted that, in this stage, the high voltage +VDD is imparted to the substrate (body) of the N-type MOSFET 4, and −VSS is imparted to the source electrode of the N-type MOSFET 4. Therefore, a voltage in a forward direction is applied across the diode consisting of the N-type layer of the source electrode and the P-type layer of the substrate. However, since the power source voltage is only about 0.5 V, which is lower than the contact voltage of the PN diode, no current flows through the PN diode even if the voltage is applied across the PN diode in a forward direction. Similarly, a low voltage −VSS is imparted to the substrate (body) of the P-type MOSFET 3 and a high voltage +VDD is imparted to the source electrode of the P-type MOSFET, with result that a voltage is applied in a forward direction across the diode consisting of the P-type layer of the source electrode and the N-type layer of the substrate. However, since the power source voltage is only about 0.5 V, which is lower than the contact voltage of the PN diode, no current flows through the PN diode even if the voltage is applied across the PN diode in a forward direction.

In this embodiment, the substrate voltage (body voltage) of each of the P-type MOSFET 3 and the N-type MOSFET 4 is controlled during the oscillating-amplifying operation, whereby the threshold voltage of each of the P-type MOSFET 3 and the N-type MOSFET 4 can be lowered by the back gate effect. In order to lower the threshold voltage of MOSFET, it is generally necessary to perform ion doping for a body additionally. In this embodiment, however, ion doping need not be performed additionally for the body because the threshold voltage of MOSFET can be lowered as described above. Naturally, the ion doping step for lowering the threshold voltage can be omitted so as to decrease the number of steps, resulting in a reduction in manufacturing cost.

Next, an oscillation amplifying operation of the amplifying circuit 120 shown in FIG. 1 will now be described.

A signal VGL+A sin ωt, which is the sum of the DC component VGL and the AC component A sin ωt, is supplied to the gate terminal 8 connected to the gate electrode of each of the P-type MOSFET 3 and the N-type MOSFET 4 shown in FIG. 1. The input signal is amplified in the amplifying circuit 120 and fed back to the gate terminal 8 via the feedback resistor 5 and the feedback circuit 10 shown in FIG. 1 so as to repeat the amplifying-oscillating function, with the result that the signal is stabilized.

Suppose the characteristics of the P-type MOSFET 3 are denoted by βp (beta characteristics) and Vthp (threshold voltage). Likewise, the characteristics of the N-type MOSFET 4 are denoted by βn (beta characteristics) and Vthn (threshold voltage). In this case, the AC signal after stabilization by the mutual attraction in operation of the P-type MOSFET 3 and the N-type MOSFET 4 has a DC level VGL as a bias voltage. The DC level VGL is represented by:

$$VGL=[VDD-Vthp+(\beta n/\beta p)^{1/2} \cdot Vthn]/[1+(\beta n/\beta p)^{1/2}], \qquad (1)$$

Also, the gain G of the amplifying circuit is represented by:

$$G=\beta(VDD-2Vth)/\omega C \qquad (2)$$

where βp=βn=β, Vthp=Vthn=Vth, C is the capacitance of the capacitor 10 acting as a load, and ω is the angular frequency of oscillation.

Since the threshold voltage Vth of each of the two MOSFETs 3 and 4 included in the amplifying circuit can be diminished seemingly as described above, it is possible to obtain the effect that the gain G shown in equation (2) can be increased.

An operation to stop the low voltage oscillation amplifying circuit will now be described. In the case where the voltage of the control signal terminal 7 is set at a low level in an attempt to turn off the amplifying circuit 120, the output of the inverter circuit 6 bears a high voltage of +VDD so as to turn off each of the P-type MOSFET 1 and the P-type MOSFET 2. However, since the P-type MOSFET 1, the P-type MOSFET 2, and the P-type MOSFET 3 are prepared by the same manufacturing process and since the P-type MOSFET 3 is operated at a low voltage, the threshold voltage of each of the P-type MOSFET 1 and the P-type MOSFET 2 is set at a very low level. Accordingly, even if a high voltage +VDD, at which each of the P-type MOSFET 1 and the P-type MOSFET 2 must be turned off, is imparted to the gate voltage, a leakage current may flow to some extent.

Under the circumstances, the gate voltage is set at +VDD in order to turn off the series circuit consisting of the P-type MOSFET 1 and the P-type MOSFET 2 collectively constituting the switching circuit 110. Also, the source electrode of the P-type MOSFET 1 is set at +VDD, and the drain electrode of the P-type MOSFET 2 through which the current is most prone to flow is set at −VSS. In this case, the voltage of the source electrode of the P-type MOSFET 2, which is equal to the voltage of the drain electrode of the P-type MOSFET 1, is intermediate between the voltages +VDD and −VSS, which is considerably lower than +VDD, the intermediate voltage being termed VM. It should be noted that, in this case, the source electrode of the P-type MOSFET 2 bears the voltage VM that is considerably lower than the voltage +VDD, and the gate voltage is +VDD. Therefore, it is found that the gate voltage is further rendered higher than the source voltage. Since the source voltage that allows MOSFET to be turned off is +VDD in general, the source voltage set at VM provides a condition under which current is less likely to flow.

Accordingly, even when the threshold voltage is set at a low level such that a leakage current is observed to some extent in the case of a single P-type MOSFET as described previously, the leakage current can be prevented almost completely by connecting the P-type MOSFET 1 and the P-type MOSFET 2 in series as shown in FIG. 1 in the case where these MOSFETs are turned off by setting the control signal terminal 7 at a low voltage.

This fact will be described in more detail.

The relations between the voltages during the turn-off of the P-type MOSFETs 1 and 2 that forms the switching circuit 110 for preventing the leakage current will be described with reference to FIG. 5.

When the P-type MOSFETs 1 and 2 are turned off, the gate voltage and the substrate voltage of each of these P-type MOSFETs 1 and 2 are both +VDD. The source voltage of the P-type MOSFET 1 is +VDD, and the drain voltage of the P-type MOSFET 2 is −VSS. Further, the voltage VM at a connecting point 12 between the drain electrode of the P-type MOSFET 1 and the source electrode of the P-type MOSFET 2 is between −VSS and +VDD, i.e., −VSS<VM<+VDD.

Figure 3:
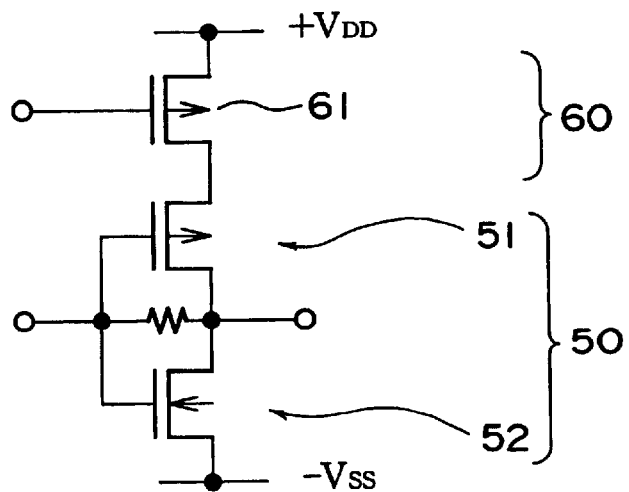
FIG. 3 is a circuit diagram exemplifying a conventional amplifying circuit.
Figure 6:
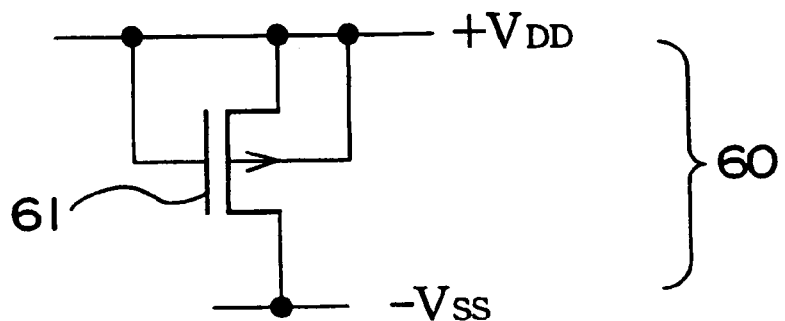
FIG. 6 is a diagram for explaining the voltage state during OFF time of the single P-type MOSFET constituting the conventional switching circuit shown in FIG. 4.

FIG. 6 shows the voltage of the conventional switching circuit 60 having the single P-type MOSFET 61 shown in FIG. 3 at the time when the switching circuit 60 is turned off. When the P-type MOSFET 61 shown in FIG. 3 is in a turned off state, each of the source voltage and the gate voltage of the P-type MOSFET 61 is +VDD.

Figure 5:
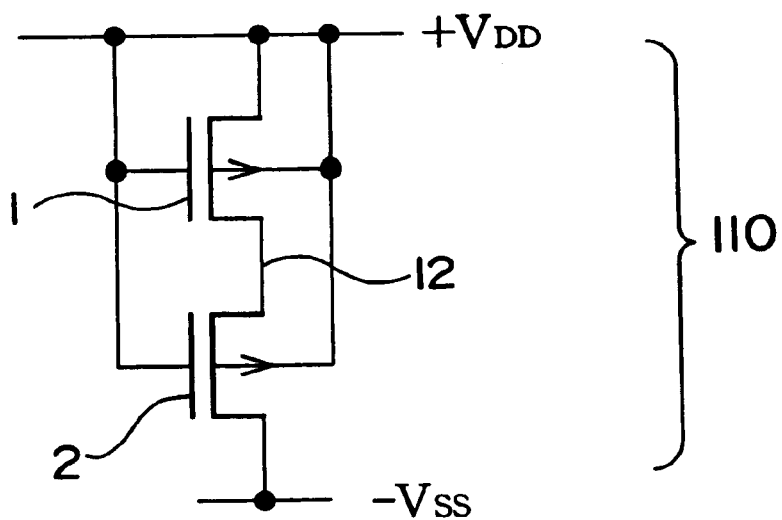
FIG. 5 is a diagram for explaining the voltage state during OFF time of the two P-type MOSFETs constituting the switching circuit shown in FIG. 1.

Accordingly, the source voltage of the P-type MOSFET 61 shown in FIG. 6 is +VDD, which is equal to the gate voltage, whereas, the source voltage VM of the P-type MOSFET 2 shown in FIG. 5 is lower than the gate voltage +VDD.

In general, the P-type MOSFET is turned on or off depending on the condition as to whether or not the voltage difference VSG between the source and gate is larger than the threshold voltage Vthp. In other words, the P-type MOSFET is turned on if the voltage difference VSG is larger than Vthp (VSG>Vthp) and is turned off if the voltage difference VSG is smaller than the Vthp (VSG<Vthp).

In the case of the P-type MOSFET 61 shown in FIG. 6, VSG=VDD−VDD=0. It follows that the P-type MOSFET 61 shown in FIG. 6 is turned off under the condition of the Vthp>VSG=0, i.e., if the threshold voltage Vthp is positive, so that no leakage current flows theoretically.

However, since the voltage-current characteristics of the P-type MOSFET with a low threshold voltage are not sharp, a leakage current flows to some extent in some cases even if the threshold voltage Vthp is positive.

On the other hand, the P-type MOSFET 2 shown in FIG. 5 bears the relationships VSG=VM=VDD<0. This means that, even under the condition of VSG<Vthp<0, i.e., even if the threshold voltage Vthp is negative, the P-type MOSFET 2 shown in FIG. 5 is turned off. In other words, the threshold voltage Vthp during OFF time of the P-type MOSFET 2 shown in FIG. 5 is rendered seemingly higher by (VDD−VM) than that of the P-type MOSFET 61 shown in FIG. 6. This means that the P-type MOSFET 2 can be set to the state of OFF stronger than that of the P-type MOSFET 61 shown in FIG. 6. Specifically, the P-type MOSFET 2 can be set to a situation where a leakage current can not easily flow.

Particularly, since the voltage VM is considerably lower than the voltage VDD, a high effect of preventing the leakage current can be obtained.

As described above, it is possible to realize a low voltage oscillation amplifying circuit that performs its function under a low power source, i.e., above 0.5 V, and that permits preventing the leakage current substantially completely during the OFF time.

The embodiment in which the SIO substrate was used was described above. However, it is also possible to use an SOS (silicon-on-sapphire) substrate or an ordinary bulk substrate if the bulk substrate is formed in a triple well structure.

Also, the switching circuit 110 includes two P-type MOSFETs 1 and 2 connected in series in the embodiment described above. However, it is also possible to use three or more P-type MOSFETs connected in series, if it is intended to prevent the leakage current more satisfactorily.

Also, in the embodiment described above, P-type MOSFETs are used for forming the switching circuit 110. However, it is also possible to use N-type MOSFETs in place of the P-type MOSFETs for forming the switching circuit 110 and to connect the switching circuit 110 to the negative electrode, i.e., the power source −VSS.

Also, the feedback resistor 5 is formed of a diffused resistor in the embodiment described above. However, it is also possible to use a polycrystalline silicon resistance or an equivalent resistance of an MOSFET. Further, the feedback resistor may be placed on the outside of the integrated circuit.

The low voltage oscillation amplifying circuit of the present invention can be used in various portable electronic instruments using a battery or a charger, such as an electronic watch or a mobile computer.

What is claimed is:

1. A low voltage oscillation amplifying circuit, comprising:
   a switching circuit including first and second insulated gate field effect transistors of the same conductivity type being connected in series and having gate electrodes connected to each other;
   an amplifying circuit connected to said switching circuit and including a third insulated gate field effect transistor of a first conductivity type and a fourth insulated gate field effect transistor of a second conductivity type, drain electrodes of said third and fourth insulated gate field effect transistors being connected to each other to provide a common drain electrode, and gate electrodes of said third and fourth insulated gate field effect transistors being connected to each other to provide a common gate electrode;

a feedback resistor connected between said common gate electrode and said common drain electrode of said third and fourth insulated gate field effect transistors;

a control circuit including a control signal terminal and an inverter circuit for outputting an inverted signal obtained by inverting a control signal inputted to said control signal terminal;

a power source of a first polarity connected to said switching circuit; and a power source of a second polarity connected to said amplifying circuit;

wherein a body of each of said third and fourth insulated gate field effect transistors is insulatively isolated, a voltage of said body of said fourth insulated gate field effect transistor is controlled by said control signal of said control circuit, and a voltage of said body of said third insulated gate field effect transistor is controlled by said inverted signal.

2. The low voltage oscillation amplifying circuit as defined in claim 1, wherein said control signal terminal is connected to said body of said fourth insulated gate field effect transistor; and wherein said inverter circuit is connected to said gate electrode of each of said first and second insulated gate field effect transistors and also to said body of said third insulated gate field effect transistor.

3. The low voltage oscillation amplifying circuit as defined in claim 1, wherein said first and second insulated gate field effect transistors are of P-type, a source electrode of said first insulated gate field effect transistor being connected to a power source of a positive polarity;

wherein said third insulated gate field effect transistor is of P-type; and wherein said fourth insulated gate field effect transistor is of N-type, a source electrode of said fourth insulated gate field effect transistor being connected to a power source of a negative polarity.

4. The low voltage oscillation amplifying circuit as defined in claim 1, wherein said first and second insulated gate field effect transistors are of N-type, a source electrode of said first insulated gate field effect transistor being connected to a power source of a negative polarity;

wherein said third insulated gate field effect transistor is of N-type; and wherein said fourth insulated gate field effect transistor is of P-type, a source electrode of said fourth insulated gate field effect transistor being connected to a power source of a positive polarity.

5. The low voltage oscillation amplifying circuit as defined in claim 1, wherein a voltage difference between voltages of said power source of the first polarity and said power source of the second polarity is lower than a contact voltage of a PN diode formed between said source and body in each of said third and fourth insulated gate field effect transistors.

6. The low voltage oscillation amplifying circuit as defined in claim 1, wherein each of said first to fourth insulated gate field effect transistors is formed of a silicon on insulator (SOI) structure.

7. A portable electronic instrument comprising a low voltage oscillation amplifying circuit as defined in claim 1.

* * * * *